United States Patent
Gu et al.

(10) Patent No.: US 6,875,702 B2
(45) Date of Patent: Apr. 5, 2005

(54) PLASMA TREATMENT SYSTEM

(75) Inventors: Shiqun Gu, Vancouver, WA (US);
Derryl D. J. Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/878,820

(22) Filed: Jun. 11, 2001

(65) Prior Publication Data

US 2002/0187643 A1 Dec. 12, 2002

(51) Int. Cl.⁷ ............... H01L 21/302; H01L 21/461; H01L 21/31
(52) U.S. Cl. ............... 438/723; 438/724; 438/758; 438/765; 438/785
(58) Field of Search .................. 438/625, 626, 438/632, 640, 700, 706, 714, 723, 738, 720, 724, 758, 765, 785; 134/1.1–1.3

(56) References Cited

U.S. PATENT DOCUMENTS

| | | | | |
|---|---|---|---|---|
| 5,882,489 A | * | 3/1999 | Bersin et al. | 438/706 |
| 5,970,378 A | * | 10/1999 | Shue et al. | 438/656 |
| 6,133,143 A | * | 10/2000 | Lin et al. | 438/725 |
| 6,180,518 B1 | * | 1/2001 | Layadi et al. | 438/738 |
| 6,204,192 B1 | * | 3/2001 | Zhao et al. | 438/723 |
| 6,323,121 B1 | * | 11/2001 | Liu et al. | 438/738 |
| 6,365,495 B2 | * | 4/2002 | Wang et al. | 438/582 |

* cited by examiner

Primary Examiner—Duy-Vu N. Deo
(74) Attorney, Agent, or Firm—Luedeka, Neely & Graham

(57) ABSTRACT

A process for forming a conductive via in an integrated circuit structure that includes a first dielectric layer overlying a first conductive layer. A via cavity is formed in the first dielectric layer, which exposes the first conductive layer. A titanium nitride liner layer is formed in the via cavity, and the titanium nitride liner layer is exposed to an isotropic plasma containing hydrogen ions, thereby densifying the liner layer. A second conductive layer is formed adjacent the titanium nitride liner layer in the via cavity, which second conductive layer substantially fills the via cavity to form the conductive via. The via cavity is selectively etched with a hydrogen containing plasma prior to forming the titanium nitride liner layer. The plasma etch at least partially removes residue in the bottom of the via cavity, including carbon and oxygen.

18 Claims, 5 Drawing Sheets

PLASMA TREATMENT SYSTEM

FIELD

This invention relates to the field of integrated circuit fabrication. More particularly the invention relates to plasma treatment of integrated circuit structures.

BACKGROUND

Generally, conductive vias are used in integrated circuits to provide electrical connection between a conductor on a first layer and a conductor on a second layer that is above the first layer, where there is a dielectric layer between the first and second layers. The formation of vias typically involves etching through the intervening dielectric layer prior to the deposition of the second layer, and then removing the mask used in the etching process. The etching and mask removal steps typically leave a residue in the bottom of the via cavity, which residue reduces the conductivity of the via if not adequately removed or otherwise accounted for. Physical sputtering processes are often used to remove such residue from the bottom of via cavities. However, sputtering also causes removal of some of the dielectric material, such as from the walls of the via cavity, and tends to redeposit the dielectric debris in the bottom of the via cavity. Such debris also tends to reduce the conductivity of the via.

Formation of vias also typically involves depositing a liner material, such as titanium nitride, on the bottom and sides of the via cavity prior to depositing a via metal. The liner material tends to reduce electromigration of the via metal, and protects materials adjacent the via from reaction with gases used in the formation of the via metal. Liner materials deposited by chemical vapor deposition tend to be porous. If the liner material is too porous, it is less effective in performing the liner functions described above. Prior methods of reducing porosity of the liner material tend to be inadequate, especially on the sidewalls of the via cavity.

What is needed, therefore, is a more effective process for reducing the porosity of a liner material in a via cavity. A process is also needed for effectively removing residue from the bottom of a via prior to depositing the via metal.

SUMMARY

The above and other needs are met by a process for forming a conductive via in an integrated circuit structure that includes a first dielectric layer overlying a first conductive layer. A via cavity is formed in the first dielectric layer, which exposes the first conductive layer. A titanium nitride liner layer is formed in the via cavity, and the titanium nitride liner layer is exposed to an isotropic plasma containing hydrogen ions, thereby densifying the liner layer. A second conductive layer is formed adjacent the titanium nitride liner layer in the via cavity, which second conductive layer substantially fills the via cavity to form the conductive via. In a most preferred embodiment, the via cavity is etched with a hydrogen containing plasma prior to forming the titanium nitride liner layer. The plasma etch at least partially removes residue in the bottom of the via cavity, including carbon and oxygen.

Thus, by using an isotropic hydrogen containing plasma to densify the titanium nitride line layer, both the sidewalls of the liner layer and the bottom of the liner layer are densified. Thus, the benefits of densification are not limited to just the bottom of the liner layer. Further, by including an amount of hydrogen in the plasma used to clean the residue from the bottom of the via cavity, a greater amount of the residue is removed from the bottom of the via cavity. Thus, the processes according to the present invention tend to produce a more reliable via structure.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Referring now to FIGS. 1A–1H and 2, there are generally depicted steps of a process for fabricating an integrated circuit structure 10 according to a preferred embodiment of the invention. Described below are the major steps in the process according to the invention. Other common steps not described in detail herein may also be required to complete the processing, such as photoresist removal and rinsing steps.

Figure 1A:
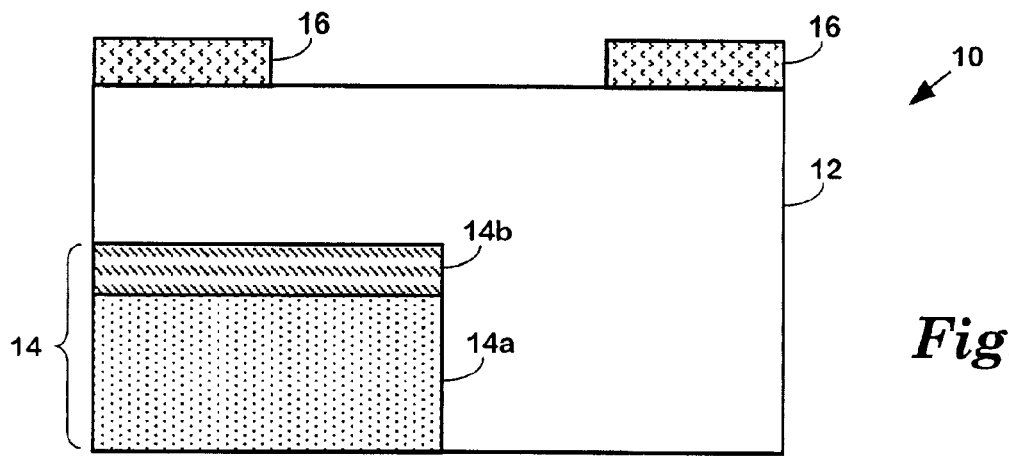
FIGS. 1A–1H depict a via structure formed according to a preferred embodiment of the invention.

As shown in FIG. 1A, at an initial point in the process, the structure 10 includes a first dielectric layer 12 covering a conductor 14. The first dielectric layer 12, which is most preferably a silicon oxide, may also be referred to as an interlayer dielectric or an inter metal dielectric depending upon the function of the layer 12 in the completed integrated circuit structure 10. The conductor 14 preferably includes a layer of metal 14a, such as copper or aluminum, covered by an antireflective coating 14b, such as titanium nitride.

Figure 2:
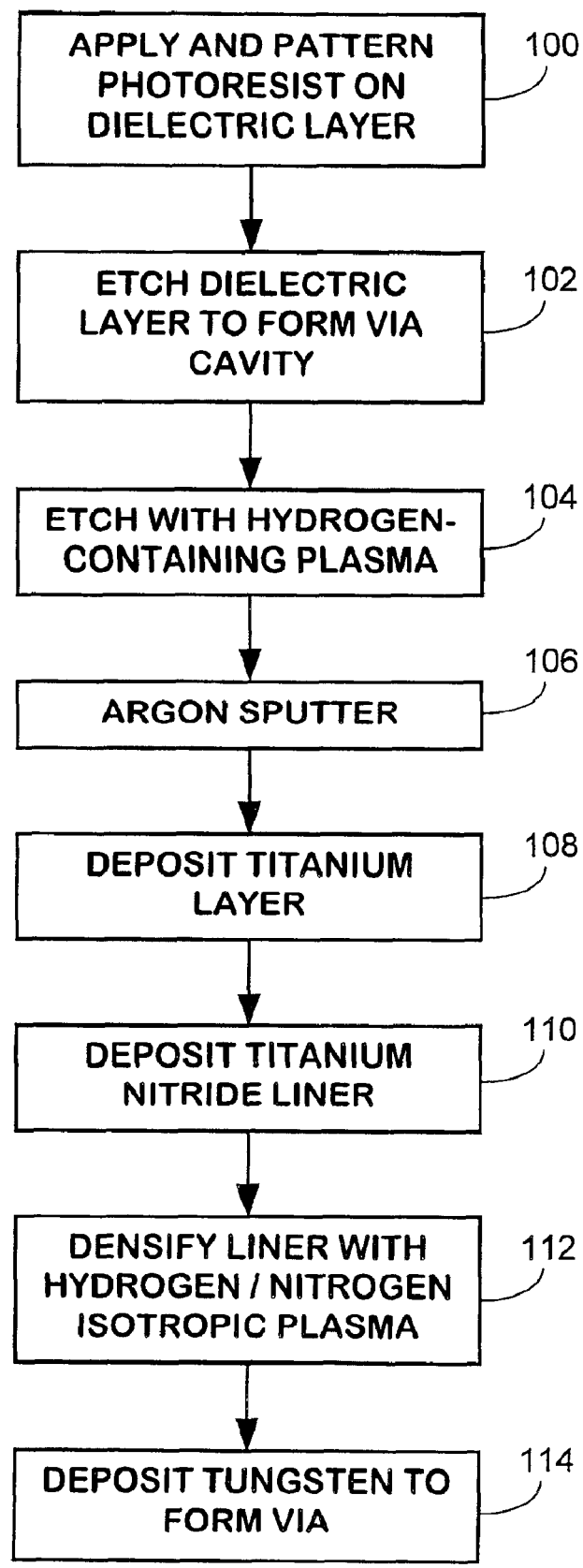
FIG. 2 depicts a fabrication process flow according to a preferred embodiment of the invention.

As shown in FIGS. 1A and 2, photoresist is applied to the dielectric layer 12 and patterned (step 100) to form a mask layer 16, also referred to herein as a via mask. Preferably, the mask layer 16 is patterned according to standard photolithography processing to leave photoresist over portions of the layer 12 which are to remain after completion of an etching step described below.

Figure 1B:
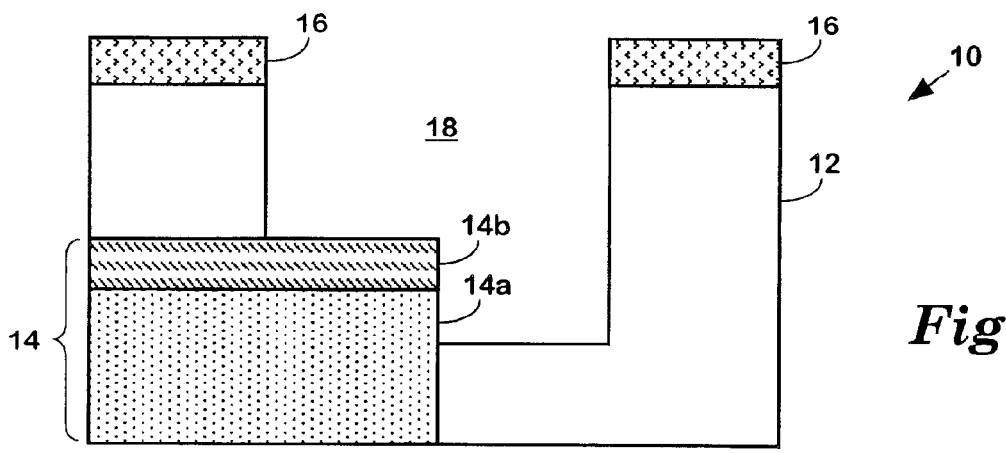

After masking, the structure 10 as shown in FIG. 1A is exposed to an etchant to remove portions of the first dielectric layer 12 (step 102), thereby forming the structure 10 depicted in FIG. 1B. As shown in FIG. 1B, etching the layer 12 forms a via cavity 18 through which the conductor 14 is exposed. Depending on the position of the via cavity relative to the edge of the conductor 14 as determined by the via mask layer 16, and depending on the duration of the etch, the via cavity 18 may encompass the edge of the conductor 14, and may extend below the top of the conductor 14. However, it is appreciated that the scope of the invention is not limited by any particular position of the via cavity 18 relative to an edge of the conductor 14.

Figure 1C:
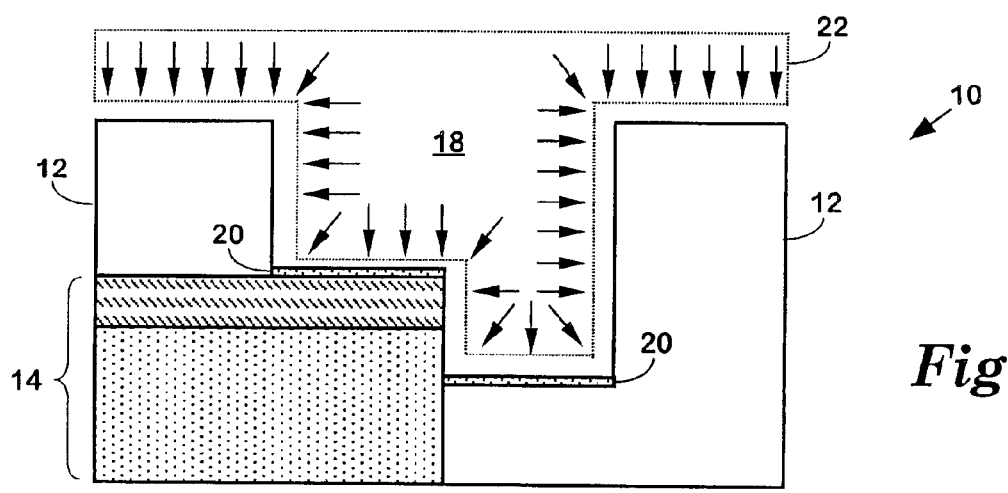

As shown in FIG. 1C, after removal of the via mask layer 16, a residue 20 may accumulate in the bottom of the via cavity 18. If not removed, the residue 20 tends to introduce electrical resistance between the conductor 14 and a later-formed conductive via. The residue 20 may include materials such as carbon, oxygen, silicon, and titanium or titanium nitride.

According to the preferred embodiment of the invention, the residue 20 is removed such as by a reduction reaction caused by exposure of the residue 20 to a substantially anisotropic hydrogen-containing plasma 22 (step 104). Preferably, hydrogen ions in the plasma 22 react with the carbon and oxygen in the residue 20 to form gaseous byproducts. After removal of the carbon and oxygen components, the remaining residue 20 may be more efficiently removed by a later sputtering operation.

Figure 3A:
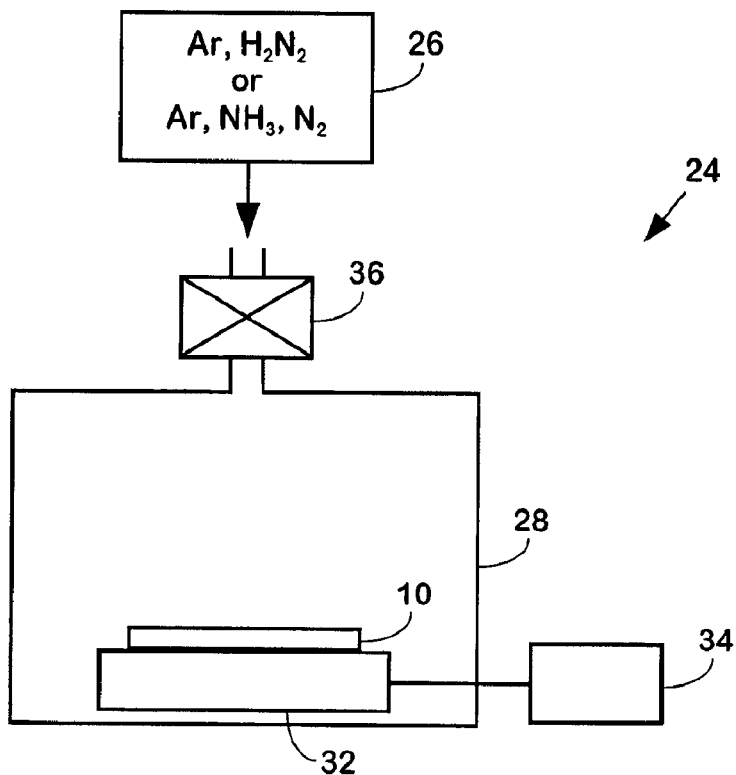
FIGS. 3A and 3B depict apparatuses for applying plasma treatments to integrated circuit structures according to preferred embodiments of the invention.

In the preferred embodiment of the invention, the hydrogen-containing plasma 22 is generated and provided to the structure 10 by an apparatus as shown in FIG. 3A. Preferably, Argon and $H_2N_2$ gases 26, or Argon, $NH_3$, and $N_2$ gases 26, or Argon and Hydrogen gases 26 are excited by a microwave source 36 to form the plasma 22, as depicted in FIG. 1C. The plasma 22, which is preferably substantially anisotropic, provides a directional flow of ions toward the structure 10 which is mounted on a heated holder 32 in a vacuum chamber 28. Since the plasma 22 is substantially anisotropic (directional), it treats mainly the bottom surfaces of the via cavity 18 where the residue 20 tends to be concentrated. As shown in FIG. 3A, an RF power source 34 is provided to bias the holder 32 and the structure 10 mounted thereon.

Figure 1D:
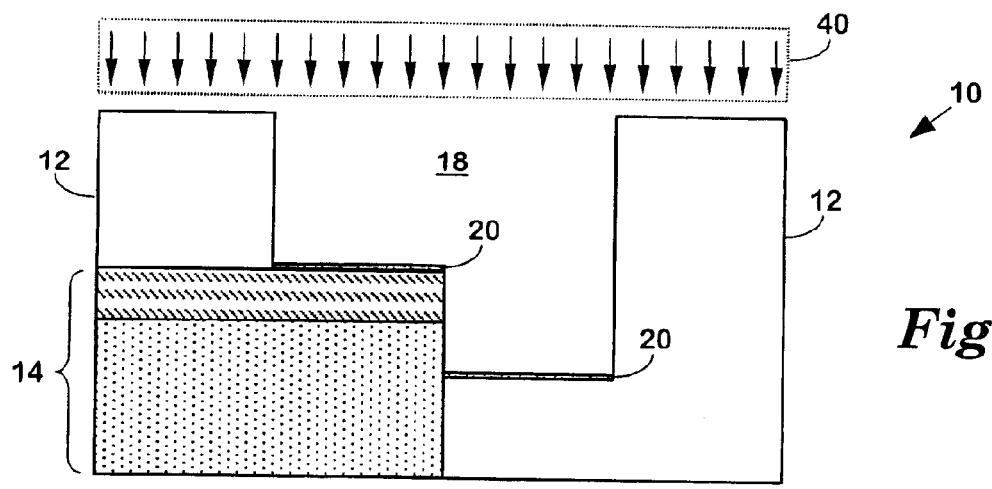

After removal of the carbon and oxygen components of the residue 20, any remaining residue 20 and other surface contamination may be removed by Argon sputtering 40, as shown in FIG. 1D (step 106 in FIG. 2). In prior systems, Argon sputtering was generally the only means used to remove the residue 20, and high sputtering power was used in attempts to remove the full thickness of the residue 20. However, the use of high sputtering power tends to erode portions of the $SiO_2$ layer 12 which are then redeposited in the bottom of the via cavity 18. According to the present invention, the Argon sputtering operation, if necessary at all, may be performed at significantly lower power levels, thereby reducing the opportunity for damage to the $SiO_2$ layer 12.

The above described sputter cleaning processes, using a Hydrogen containing plasma optionally followed by an Argon containing plasma, may alternately be performed using a plasma that is generated remotely, such as by microwave generation or inductive coupling generation, as described in more detail hereafter. The remotely formed plasma tends to be substantially isotropic, as generally depicted in FIG. 1C, rather than substantially anisotropic, as generally depicted in FIG. 1D. It is appreciated that either the Hydrogen containing plasma or the Argon containing plasma may each be either one of isotropic or anisotropic as desired, and the use of a remote plasma for one of the two processes does not indicate that the other process must use a remote plasma.

Figure 1E:
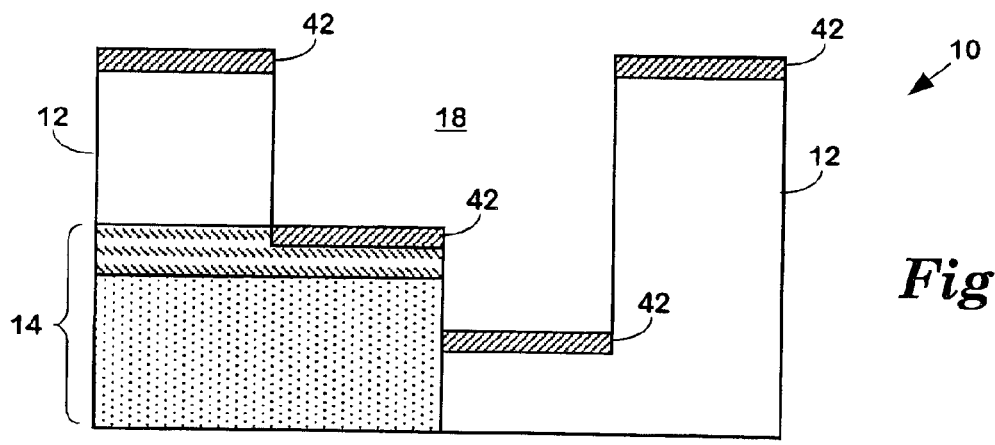

As depicted in FIG. 1E, the preferred process next includes application of a thin titanium layer 42, preferably such as by sputtering or alternately by chemical vapor deposition (step 108). The titanium layer 42 preferably reacts with any remaining portions of the resistive residue layer 20, thereby cleansing, or gettering, the bottom of the via cavity 18 and forming a conductive layer. The minimum necessary thickness of the titanium layer 42 is determined at least in part by the thickness of any remaining residue layer 20. As discussed above, including the hydrogen plasma etch (step 104) preferably reduces the overall thickness of the residue layer 20. Thus, inclusion of the hydrogen plasma etch step preferably reduces the necessary thickness of the titanium layer 42.

Figure 1F:
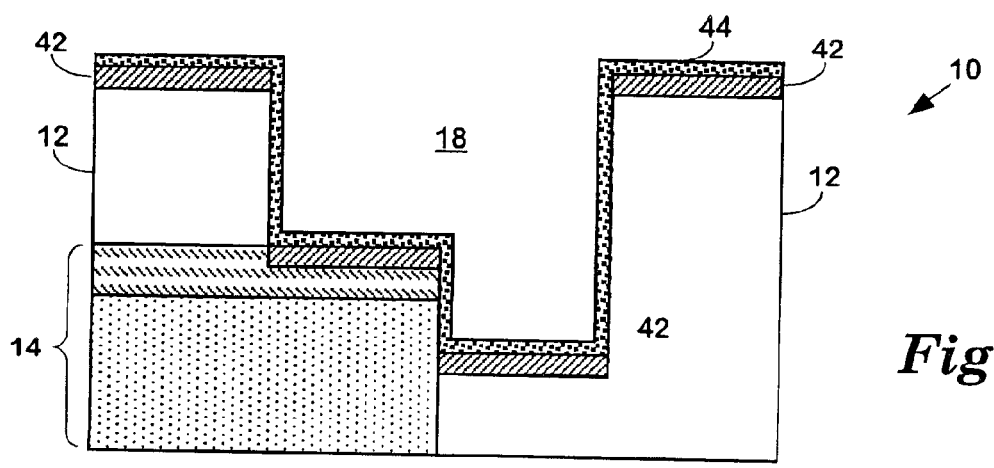

With reference to FIG. 1F, a liner layer 44, preferably of titanium nitride, is next deposited over the structure 10 (step 110). In the preferred embodiment, the titanium nitride liner 44 is formed on the heated structure 10 (about 400 centigrade), such as by reduction of tetrakis dimethylamine titanium (TDMAT), with helium as the carrier gas. This reduction reaction tends to produce a titanium nitride layer 44 having interspersed hydrocarbons which are a byproduct of the reaction. Due to these trapped hydrocarbons, the titanium nitride layer 44 is somewhat porous, which potentially causes several problems.

First, porous titanium nitride tends to have a higher resistivity than does titanium nitride in a more crystalline form. It is undesirable to have a high-resistance layer between the conductor 14 and the via metal to be formed later. Second, a porous titanium nitride layer 44 tends to allow fluorine gas to diffuse through and react with the underlying titanium layer 42 during a later tungsten deposition step. The reaction of fluorine gas with titanium tends to produce titanium fluoride, which is a highly resistive material. Third, a porous titanium nitride layer is generally not an effective barrier against electromigration of tungsten atoms from the via metal into the adjacent metal layer 14a. Thus, it is desirable to minimize the porosity of the titanium nitride layer 44.

Figure 1G:
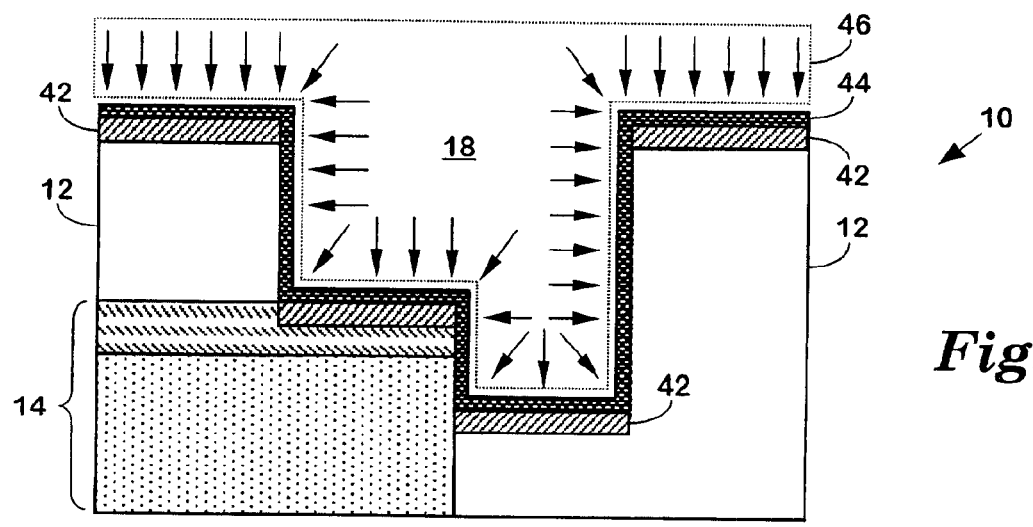

To reduce the porosity of the titanium nitride layer 44, the present invention provides for annealing the titanium nitride layer 44 using an isotropic plasma 46 of hydrogen and nitrogen ions (step 112), as depicted in FIG. 1G. It is thought that as the titanium nitride layer 44 is exposed to the plasma 46, hydrocarbons in the layer 44 react with the hydrogen and nitrogen ions to form volatile compounds, such as C—H and CN, which escape from the layer 44. This release of the trapped hydrocarbons preferably densifies the titanium nitride structure, which densification preferably reduces the thickness of the layer 44 by about 50%. In the preferred embodiment the structure 10 is heated to about 450 centigrade as it is exposed to the plasma 46, thereby enhancing the reaction of hydrogen with carbon and the growth of the grain structure of the titanium nitride layer 44.

Figure 3B:
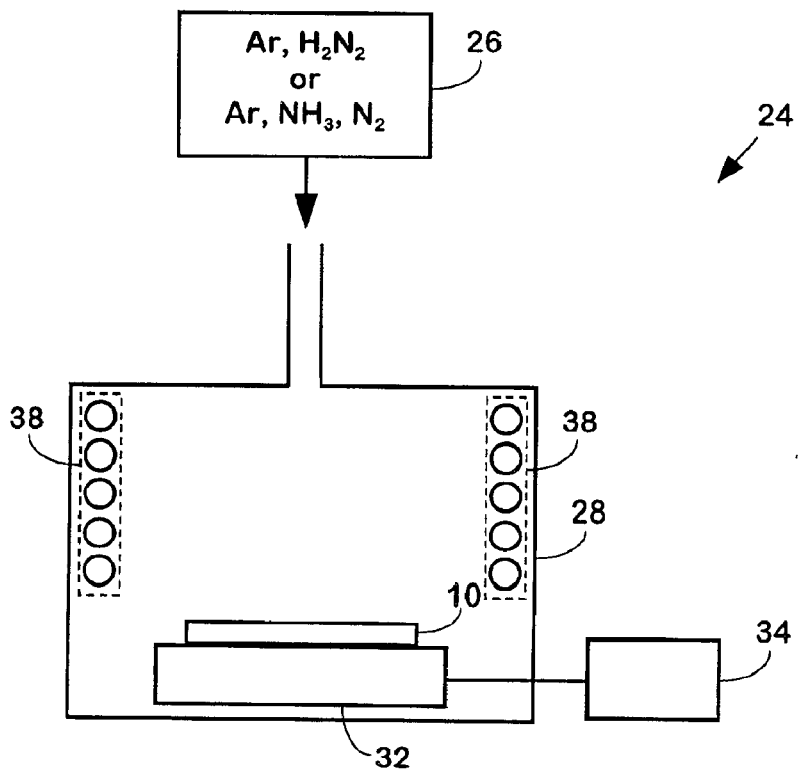

In the preferred embodiment of the invention, the hydrogen-containing plasma 46 is generated and provided to the structure 10 by the apparatus as shown in FIG. 3A or 3B. Preferably, $H_2N_2$ gas 26, or $NH_3$ and $N_2$ gases 26 are excited by the microwave source 36 (FIG. 3A) or an inductive coupling source 38 (FIG. 3B) to form the plasma 46 upstream from the structure 10. The plasma 46 is made to flow toward the structure 10, which is mounted on the heated holder 32 in the vacuum chamber 28. As the plasma 46 reaches the structure 10, it is preferably substantially isotropic (non directional), such that the hydrogen ions in the plasma 46 preferably treat all exposed surfaces of the structure 10 equally. As shown in FIGS. 3A and 3B, an RF power source 34 is provided to selectively bias the holder 32 and the structure 10 mounted thereon, as may be desired for optimum densification of the layer 44.

One of the advantages of the present invention is that the use of an isotropic plasma 46 provides for uniform exposure of all of the titanium nitride layer 44 to the plasma 46. Thus, titanium nitride on the sidewalls of the via cavity 18 preferably receives substantially the same level of plasma exposure as does titanium nitride on the bottom surfaces of the via cavity 18. This is a significant advantage over prior densification methods that have used reactive ion etching treatments that are more directional, and which tend to effectively densify only the titanium nitride on the bottom surfaces of the via cavity 18.

Another advantage of the densification process according to the present invention over prior reactive ion etching techniques is that there is no need to handle highly-flammable hydrogen gas. Formation of hydrogen and nitrogen ions from $NH_3$ and $N_2$ gases is much safer than forming the plasma from hydrogen gas. However, it is appreciated that hydrogen gas may still be used when forming the remote plasma, as desired.

Generally, isotropic plasmas have a shallower penetration depth than do more directional reactive ion etching techniques. To compensate, the titanium nitride layer 44 may be built up in stages, with the plasma annealing step performed between each titanium nitride deposition step. For example, in a preferred embodiment of the invention, approximately 20 angstroms of the titanium nitride layer 44 is deposited (step 110), followed by exposure to the plasma 46 (step 112), followed by deposition of another 20 angstroms of the titanium nitride layer 44 (step 110), and so forth.

Figure 1H:
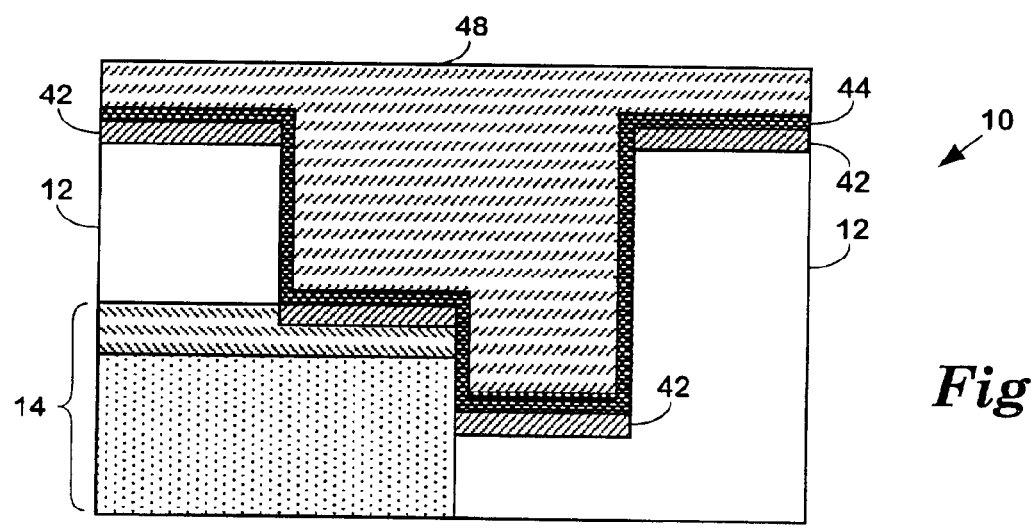

As depicted in FIG. 1H, after annealing the titanium nitride layer 44, a second conductor 48, such as tungsten, is deposited in the via cavity 18 to form a metal plug or via (step 114). In the preferred embodiment, the tungsten layer 48 is deposited by reduction of $WF_6$ gas in a chemical vapor deposition process. This reduction reaction produces highly reactive fluorine gas which, if allowed to reach the titanium layer 42, would tend to produce highly-resistive titanium fluoride. As discussed above, the titanium nitride layer 44, which has been densified during step 112, preferably substantially prohibits diffusion of the fluorine gas into the underlying titanium layer 42.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A process for forming a conductive via in an integrated circuit structure, where the integrated circuit structure includes a first dielectric layer overlying a first conductive layer, the process comprising:
   (a) forming a via cavity in the first dielectric layer, the via cavity exposing the first conductive layer;
   (b) etching the via cavity with a hydrogen-containing plasma;
   (c) in a deposition reactor, forming a liner layer in the via cavity by;
      (i) depositing a portion of the liner layer in the via cavity,
      (ii) forming an isotropic plasma of hydrogen and nitrogen ions upstream from the integrated circuit structure,
      (iii) flowing the isotropic plasma to the integrated circuit structure,
      (iv) exposing the liner layer to the isotropic plasma, thereby densifying the liner layer, including sidewalls of the liner layer, and
      (v) repeating steps (c)(i) through (c)(iv) until the liner layer is formed, and
   (d) forming a second conductive layer adjacent the liner layer in the via cavity, the second conductive layer substantially filling the via cavity to form the conductive via.

2. The process of claim 1 further comprising Argon sputtering the via cavity after step (b) and before step (c) to at least partially remove residue on the first conductive layer in the via cavity.

3. The process of claim 1 wherein step (b) comprises stripping carbon and oxygen from a residue on the first conductive layer in the via cavity.

4. The process of claim 1 wherein step (b) comprises forming hydrogen ions from at least one of the gases including $N_2H_2$, $NH_3$, and $H_2$.

5. The process of claim 1 wherein step (c) comprises forming the liner layer by chemical vapor deposition of titanium nitride.

6. The process of claim 1 wherein step (c) comprises forming the isotropic plasma by microwave excitation of at least one of the combinations of gases including $N_2H_2$, $NH_3$ and $N_2$, and $H_2$.

7. The process of claim 1 further comprising forming a titanium layer over and adjacent the first conductive layer in the via cavity after step (a) and before step (b).

8. The process of claim 1 wherein step (d) further comprises forming the second conductive layer of tungsten.

9. A process for forming a conductive via in an integrated circuit structure, where the integrated circuit structure includes a first dielectric layer overlying a first conductive layer, the process comprising:
   (a) forming a via cavity in the first dielectric layer, the via cavity exposing the first conductive layer;
   (b) forming a titanium layer over and adjacent the first conductive layer in the via cavity;
   (c) etching the via cavity with a hydrogen-containing plasma, thereby stripping carbon and oxygen from a residue on the first conductive layer in the via cavity;
   (d) Argon sputtering the via cavity to at least partially remove the residue on the first conductive layer in the via cavity;
   (e) in a deposition reactor, forming a titanium nitride liner layer in the via cavity by;
      (i) depositing a portion of the liner layer in the via cavity,
      (ii) forming an isotropic plasma of hydrogen and nitrogen ions upstream from the integrated circuit structure,
      (iii) flowing the isotropic plasma to the integrated circuit structure,
      (iv) exposing the titanium nitride liner layer to the isotropic plasma, thereby densifying the titanium nitride liner layer, including sidewalls of the titanium nitride liner layer; and
      (v) repeating steps (e)(i) through (e)iv) until the liner layer is formed and
   (f) forming a tungsten layer adjacent the titanium nitride liner layer in the via cavity, the tungsten layer substantially filling the via cavity to form the conductive via.

10. A process for forming a conductive via in an integrated circuit structure, where the integrated circuit structure includes a first dielectric layer overlying a first conductive layer, the process comprising:
   (a) forming a via cavity in the first dielectric layer, the via cavity exposing the first conductive layer;
   (b) in a deposition reactor, forming a liner layer in the via cavity by;

(i) depositing a portion of the liner layer in the via cavity,
(ii) forming an isotropic plasma of hydrogen and nitrogen ions upstream from the integrated circuit structure,
(iii) flowing the isotropic plasma to the integrated circuit structure,
(iv) exposing the liner layer to the isotropic plasma, thereby densifying the liner layer, including sidewalls of the line layer; and
(v) repeating steps (b)(i) through (b)(iv) until the liner layer is formed, and
(c) forming a second conductive layer adjacent the liner layer in the via cavity, the second conductive layer substantially filling the via cavity to form the conductive via.

11. The process of claim 10 wherein step (b)(ii) comprises forming the isotropic plasma by microwave excitation of at least one of the combination of gases including $N_2H_2$, $NH_3$ and $N_2$, and $H_2$.

12. The process of claim 10 further comprising forming a titanium layer over and adjacent the first conductive layer in the via cavity after step (a) and before step (b).

13. The process of claim 10 wherein step (c) comprises forming the second conductive layer of tungsten.

14. The process of claim 10 further comprising etching the via cavity with a hydrogen-containing plasma after step (a) and before step (b) to at least partially remove residue on the first conductive layer in the via cavity.

15. The process of claim 10 further comprising Argon sputtering the via cavity after step (a) and before step (b) to at least partially remove residue on the first conductive layer in the via cavity.

16. The process of claim 10 further comprising etching the via cavity with a hydrogen-containing plasma after step (a) and before step (b) to at least partially strip carbon and oxygen from a residue on the first conductive layer in the via cavity.

17. The process of claim 10 further comprising etching the via cavity with a hydrogen-containing plasma after step (a) and before step (b), where the hydrogen is formed from at least one of the gases including $N_2H_2$, $NH_3$, and $H_2$.

18. The process of claim 10 wherein step (b) comprises forming the liner layer of titanium nitride by chemical vapor deposition.

* * * * *